(12) United States Patent
Lin et al.

(10) Patent No.: US 10,396,234 B2
(45) Date of Patent: Aug. 27, 2019

(54) PACKAGE STRUCTURE OF LONG-DISTANCE SENSOR AND PACKAGING METHOD OF THE SAME

(71) Applicant: LINGSEN PRECISION INDUSTRIES, LTD., Taichung (TW)

(72) Inventors: Ching-I Lin, Taichung (TW); Ming-Te Tu, Taichung (TW)

(73) Assignee: Lingsen Precision Industries, Ltd., Taichung (TW)

( * ) Notice: Subject to any disclaimer, the term of this patent is extended or adjusted under 35 U.S.C. 154(b) by 0 days.

(21) Appl. No.: 15/830,284

(22) Filed: Dec. 4, 2017

(65) Prior Publication Data

US 2018/0190858 A1 Jul. 5, 2018

Related U.S. Application Data

(62) Division of application No. 15/438,164, filed on Feb. 21, 2017, now Pat. No. 10,103,286.

(30) Foreign Application Priority Data

Dec. 30, 2016 (TW) .............................. 105144094 A

(51) Int. Cl.
*H01L 31/173* (2006.01)
*H01L 31/18* (2006.01)
*H01L 31/0232* (2014.01)
*H01L 31/0203* (2014.01)
*H01L 33/52* (2010.01)
*H01L 33/58* (2010.01)
*H01L 33/54* (2010.01)
*H01L 25/16* (2006.01)

(52) U.S. Cl.
CPC ........ *H01L 31/173* (2013.01); *H01L 31/0203* (2013.01); *H01L 31/02327* (2013.01); *H01L 31/18* (2013.01); *H01L 33/52* (2013.01); *H01L 25/167* (2013.01); *H01L 33/54* (2013.01); *H01L 33/58* (2013.01); *H01L 2933/005* (2013.01); *Y02P 70/521* (2015.11)

(58) Field of Classification Search
CPC ... H01L 33/52; H01L 31/173; H01L 31/0203; H01L 2933/005
See application file for complete search history.

(56) References Cited

U.S. PATENT DOCUMENTS

2009/0097010 A1* 4/2009 Yamaguchi ........... G01S 7/4813
356/4.01

* cited by examiner

*Primary Examiner* — Amar Movva
(74) *Attorney, Agent, or Firm* — Muncy, Geissler, Olds & Lowe, P.C.

(57) ABSTRACT

A package structure of a long-distance sensor includes a substrate, a light-emitting chip, a sensing chip, two packaging gel bodies, and a cap. The substrate has a bearing surface. The light-emitting chip and the sensing chip are disposed on the bearing surface and separated from each other. The two packaging gel bodies cover the light-emitting chip and the sensing chip respectively and are separated from each other. The cap is disposed on the bearing surface and the packaging gel bodies, fastened to the bearing surface and the packaging gel bodies by adhesive, and provided with a light-emitting hole located above the light-emitting chip and a light-receiving hole located above the sensing chip.

7 Claims, 4 Drawing Sheets

PACKAGE STRUCTURE OF LONG-DISTANCE SENSOR AND PACKAGING METHOD OF THE SAME

CROSS-REFERENCE TO RELATED APPLICATIONS

This application is a Divisional of co-pending application Ser. No. 15/438,164 filed on Feb. 21, 2017, for which priority is claimed under 35 U.S.C. § 120; and this application claims priority of Application No. 105144094 filed in Taiwan, R.O.C. on Dec. 30, 2016 under 35 U.S.C. § 119; the entire contents of all of which are hereby incorporated by reference.

BACKGROUND OF THE INVENTION

1. Field of the Invention

The present invention relates generally to package structures and more particularly, to a package structure of a long-distance sensor and a packaging method of the same.

2. Description of the Related Art

The conventional package structure of the long-distance sensor is manufactured in a way that a light-emitting chip and a sensing chip are disposed on a substrate; then two packaging gel bodies are provided by molding to cover the light-emitting chip and the sensing chip respectively, and meanwhile each of the packaging gel bodies is provided on the top surface thereof with a hemispheric lens portion corresponding to the light-emitting chip and the sensing chip; at last, a cap is provided by molding to be located above the substrate and the packaging gel bodies, so that the whole packaging process is accomplished. It should be mentioned that the cap is usually provided with a light-emitting hole and a light-receiving hole for accommodating the lens portions respectively.

However, in such manner that the packaging gel bodies and the cap are formed by two times of molding, the cap is not connected with the packaging gel bodies and the substrate firmly. Besides, in such manner that the cap is formed by molding, the mold for molding can't be disposed near the lens portions, so the cap can't be located near the lens portions, causing the long-distance sensor a relatively shorter sensing distance. Therefore, the conventional package structure of the long-distance sensor and the packaging method thereof still have drawbacks and therefore need improvements.

SUMMARY OF THE INVENTION

Summarizing the above description, it is a primary objective of the present invention to provide a package structure of a long-distance sensor, which has the advantages that the packaging materials are connected relatively more firmly and the sensing distance is relatively longer.

The package structure of the long-distance sensor includes a substrate, a light-emitting chip, a sensing chip, two packaging gel bodies, and a cap. The substrate has a bearing surface. The light-emitting chip and the sensing chip are disposed on the bearing surface and separated from each other. The two packaging gel bodies cover the light-emitting chip and the sensing chip respectively and are separated from each other. The cap is disposed on the bearing surface and the packaging gel bodies, fastened to the bearing surface and the packaging gel bodies by adhesive, and provided with a light-emitting hole located above the light-emitting chip and a light-receiving hole located above the sensing chip.

As a result, the cap is fastened to the bearing surface and the packaging gel bodies by the adhesive, so that the connection between the materials of the package structure is improved.

It is another objective of the present invention to provide a packaging method of a long-distance sensor. The packaging method includes the steps of:

(a) providing a substrate and disposing a light-emitting chip and a sensing chip on a bearing surface of the substrate in a way that the light-emitting chip and the sensing chip are separated from each other;

(b) covering the light-emitting chip and the sensing chip by two packaging gel bodies respectively and separating the packaging gel bodies from each other; and (c) disposing a preformed cap on the bearing surface of the substrate and the packaging gel bodies and fastening the cap to the bearing surface of the substrate and the packaging gel bodies by adhesive.

Preferably, in the step (b) the two packaging gel bodies are formed by molding to cover the light-emitting chip and the sensing chip respectively.

As a result, because the cap is preformed, it can be directly glued by the adhesive to be fastened to the packaging gel bodies and the bearing surface. Besides, the packaging gel bodies and the cap are not formed by two times of molding respectively, so the drawback of the prior art that the cap can't be located near the packaging gel bodies and therefore the sensing distance is lowered can be overcome.

The detailed structure and features of the present invention will be specified in the detailed description of the embodiments given hereinafter. However, those skilled in the art should understand that the detailed description and the specific embodiments instanced for the implementing of the invention are given for illustration only, not for limiting the scope of the invention.

DETAILED DESCRIPTION OF THE INVENTION

Figure 1:
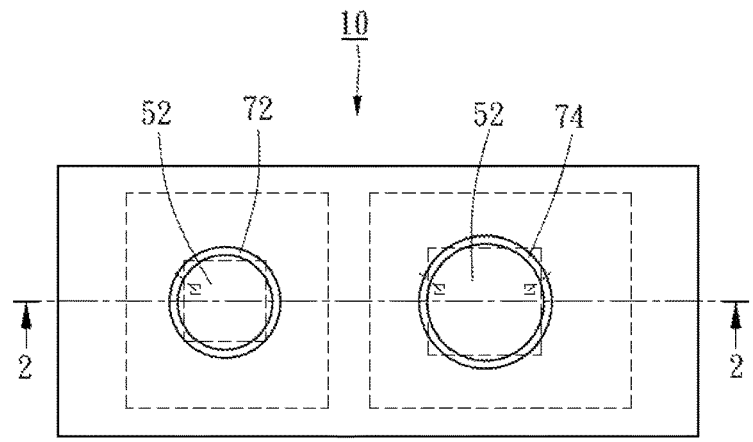
FIG. 1 is a top view of a first preferred embodiment of the present invention.
Figure 2:
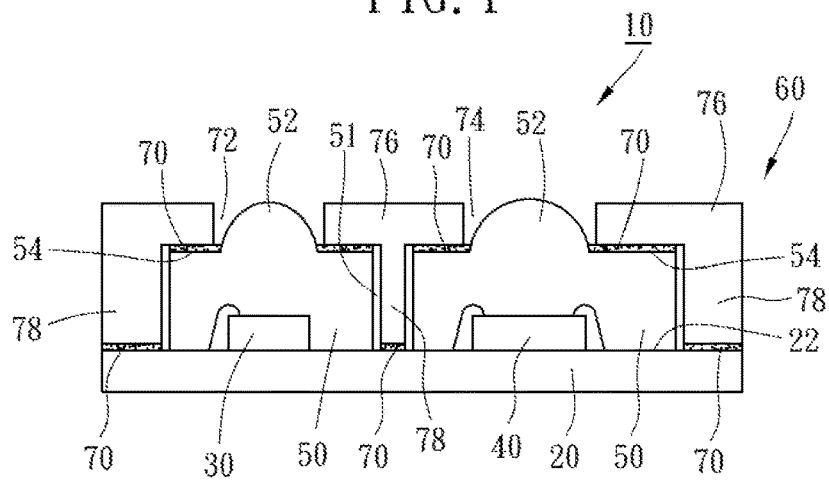
FIG. 2 is a sectional view taken along the line 2-2 in FIG. 1.

Referring to FIGS. 1-2, wherein a package structure 10 of a long-distance sensor according to a first preferred embodiment of the present invention is shown, the package structure 10 includes a substrate 20, a light-emitting chip 30, a sensing chip 40, two packaging gel bodies 50, and a cap 60.

The substrate 20 in this preferred embodiment may, but unlimited to, be a printed circuit board (usually referred to as "PCB"), a bismaleimide-triazine (usually referred to as "BT") substrate, a glass fiber substrate (usually referred to as "FR4"), or a direct bonded copper (usually referred to as "DBC") substrate. In this way, the manufacturing cost of the substrate 20 is relatively lower. The substrate 20 has a bearing surface 22.

The light-emitting chip 30 is disposed on the bearing surface 22, and may be electrically connected with the substrate 20 by wire bonding. In this preferred embodiment, the light-emitting chip 30 is an LED chip for emitting a light source.

The sensing chip 40 is disposed on the bearing surface 22 and separated from the light-emitting chip 30. The sensing chip 40 may be also electrically connected with the substrate 20 by wire bonding. The sensing chip 40 is used for sensing the light source emitted by the light-emitting chip 30.

The two packaging gel bodies 50 are formed by molding to cover the light-emitting chip 30 and the sensing chip 40 respectively. The two packaging gel bodies 50 are separated from each other, and a groove 51 is provided therebetween. The top surface of each of the packaging gel bodies 50 has a lens portion 52 and a shoulder portion 54. In this preferred embodiment, for the top surface of each of the packaging gel bodies 50, the shoulder portion 54 surrounds the lens portion 52. The lens portions 52 of the top surfaces of the packaging gel bodies 50 are hemisphere-shaped. In the manufacturing process, the radius of curvature of the lens portions 52 of the top surfaces of the packaging gel bodies 50 can be modified according to requirements. The packaging gel bodies 50 are made of a transparent material, such as transparent epoxy resin.

The cap 60 is disposed on the bearing surface 22 and the packaging gel bodies 50 and fastened to the bearing surface 22 and the packaging gel bodies 50 by adhesive 70. The cap 60 is provided with a light-emitting hole 72 and a light-receiving hole 74. The light-emitting hole 72 and the light-receiving hole 74 are located above the light-emitting chip 30 and the sensing chip 40 respectively. Specifically speaking, the cap 60 includes a transverse section 76 and a plurality of extended sections 78 extended downwardly from the transverse section 76. The transverse section 76 is provided with the light-emitting hole 72 and the light-receiving hole 74. The transverse section 76 is fastened to the shoulder portions 54 of the top surfaces of the packaging gel bodies 50 by the adhesive 70. The lens portions 52 of the top surfaces of the packaging gel bodies 50 are accommodated in the light-emitting hole 72 and the light-receiving hole 74 respectively. The extended sections 78 are located at the groove 51 and the peripheries of the packaging gel bodies 50 respectively and fastened to the bearing surface 22 by the adhesive 70.

The cap 60 is made of an opaque material, such as opaque epoxy resin.

FIGS. 4A-4D illustrate the packaging method of the package structure 10 of the long-distance sensor according to the first preferred embodiment of the present invention. The packaging method includes the following steps.

(a) Provide the substrate 20 and dispose the light-emitting chip 30 and the sensing chip 40 on the bearing surface 22 of the substrate 20 in a way that the light-emitting chip 30 and the sensing chip 40 are separated from each other.

(b) Cover the light-emitting chip 30 and the sensing chip 40 by two packaging gel bodies 50 respectively and separate the packaging gel bodies 50 from each other. It should be mentioned that the two packaging gel bodies 50 in this preferred embodiment are formed by molding to cover the light-emitting chip 30 and the sensing chip 40 respectively, and the packaging gel bodies 50 are separated from each other by direct molding. Besides, in this step when the packaging gel bodies 50 are formed, each of the packaging gel bodies 50 may be formed with a top surface having a lens portion 52 and a shoulder portion 54.

(c) Dispose a preformed cap 60 on the bearing surface 22 of the substrate 20 and the packaging gel bodies 50 and fasten the cap 60 to the bearing surface 22 of the substrate 20 and the packaging gel bodies 50 by adhesive 70. Specifically speaking, in this step the adhesive 70, such as opaque epoxy resin, may be applied to the bearing surface 22 of the substrate 20 and the shoulder portions 54 of the top surfaces of the packaging gel bodies 50 by dispensing, then the cap 60 is disposed on the bearing surface 22 of the substrate 20 and the packaging gel bodies 50, and then the cap 60 is fastened to the bearing surface 22 of the substrate 20 and the shoulder portions 54 of the top surfaces of the packaging gel bodies 54 by baking.

FIGS. 5A-5E illustrate the packaging method of the package structure 10' of the long-distance sensor according to a second preferred embodiment of the present invention. It should be mentioned that the step (a) of the second preferred embodiment is the same with the step (a) of the first preferred embodiment. The two embodiments are different in that in the step (b) of the second preferred embodiment a single packaging gel body 55 is formed by molding to cover the light-emitting chip 30 and the sensing chip 40, and at the same time the aforesaid single packaging gel body 55 is formed with a top surface having two lens portions 52 which are located above the light-emitting chip 30 and the sensing chip 40 respectively. Then, the aforesaid single packaging gel body 55 is cut into two packaging gel bodies 50' separated from each other, wherein the packaging gel bodies 50' cover the light-emitting chip 30 and the sensing chip 40 respectively.

After that, in the step (c) of the second preferred embodiment the adhesive 70, such as tin paste, is applied to the bottom of the cap 60 by screen printing. At the same time, the shoulder portions 54 of the top surfaces of the packaging gel bodies 50' and the position between the packaging gel bodies 50' are applied with the adhesive 70, such as opaque epoxy resin, by dispensing. After that, the cap 60 is disposed on the bearing surface 22 of the substrate 20 and the packaging gel bodies 50', and then the cap 60 is fastened to the bearing surface 22 of the substrate 20 and the shoulder portions 54 of the top surfaces of the packaging gel bodies 50' by baking.

Figure 3:
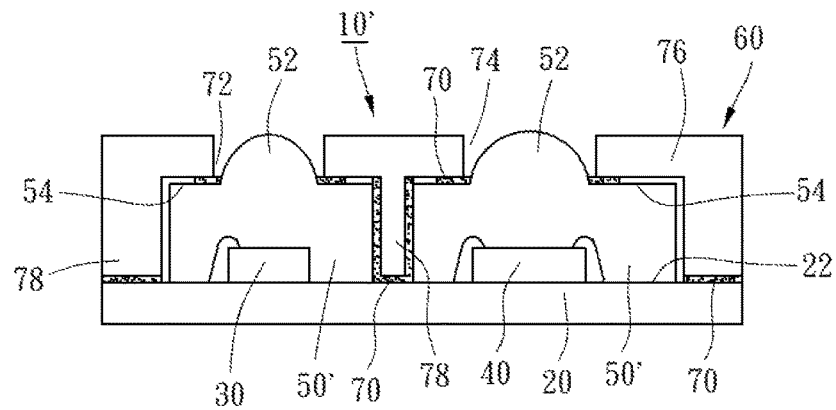
FIG. 3 is a sectional view of a second preferred embodiment of the present invention.
Figure 4A:
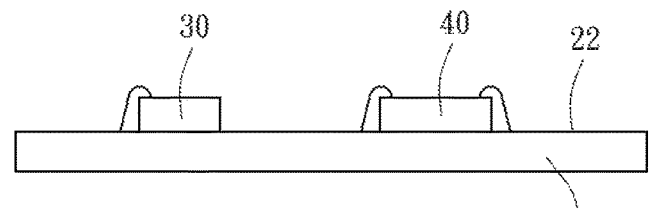
FIGS. 4A-4D are sectional views showing the manufacturing process of the first preferred embodiment of the present invention.
Figure 4B:
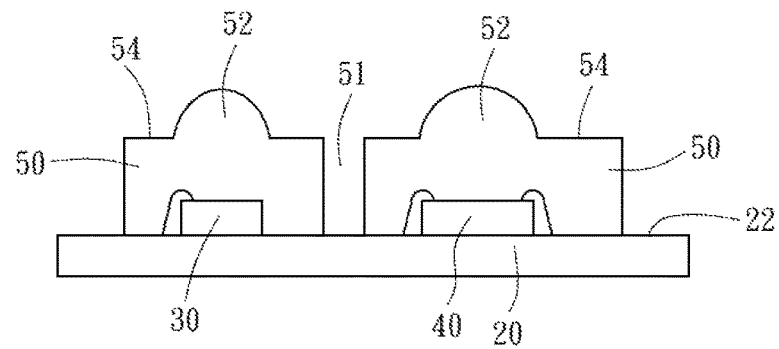
Figure 4C:
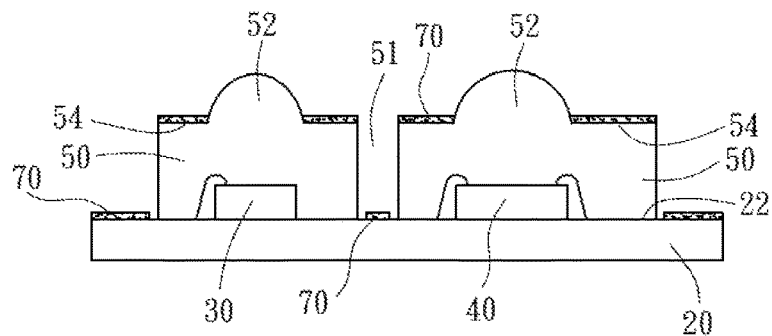
Figure 4D:
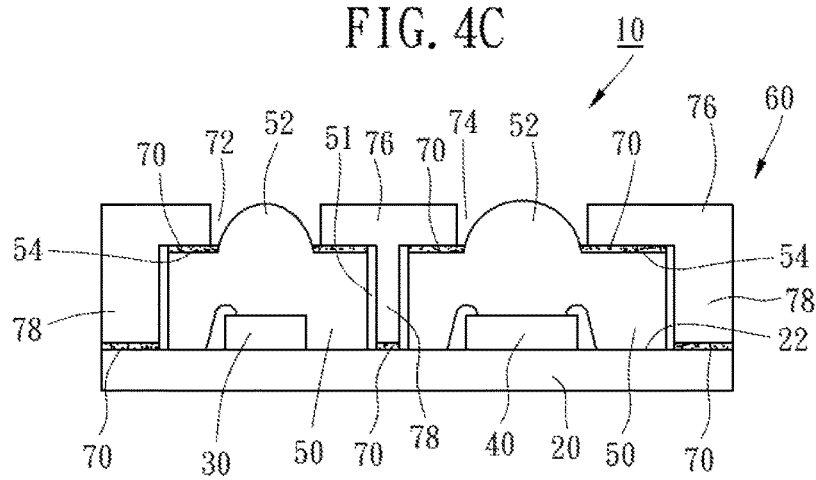
Figure 5A:
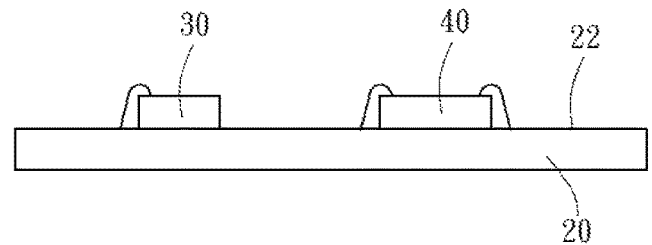
FIGS. 5A-5E are sectional views showing the manufacturing process of the second preferred embodiment of the present invention.
Figure 5B:
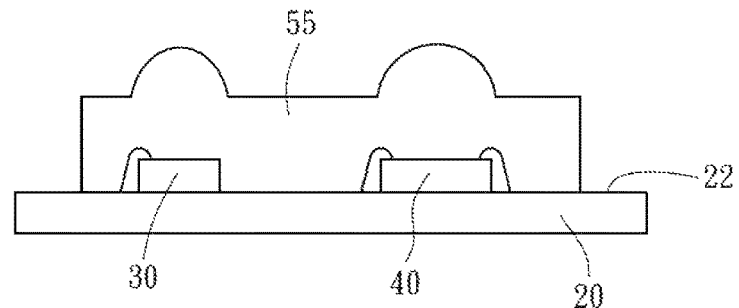
Figure 5C:
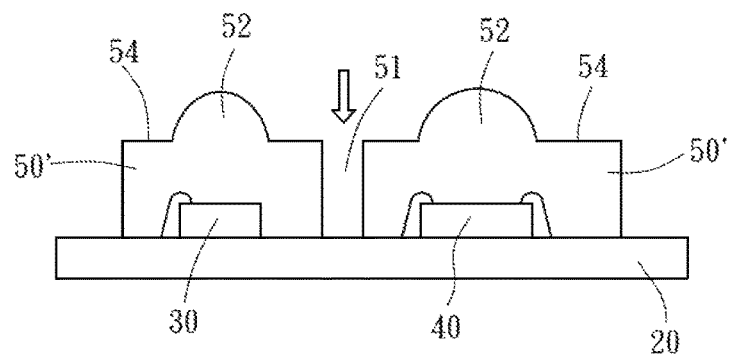
Figure 5D:
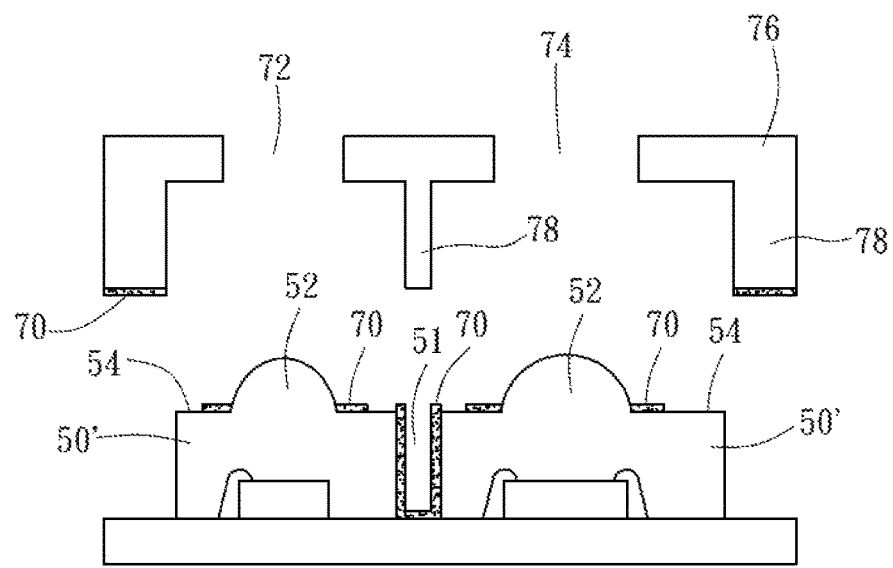
Figure 5E:
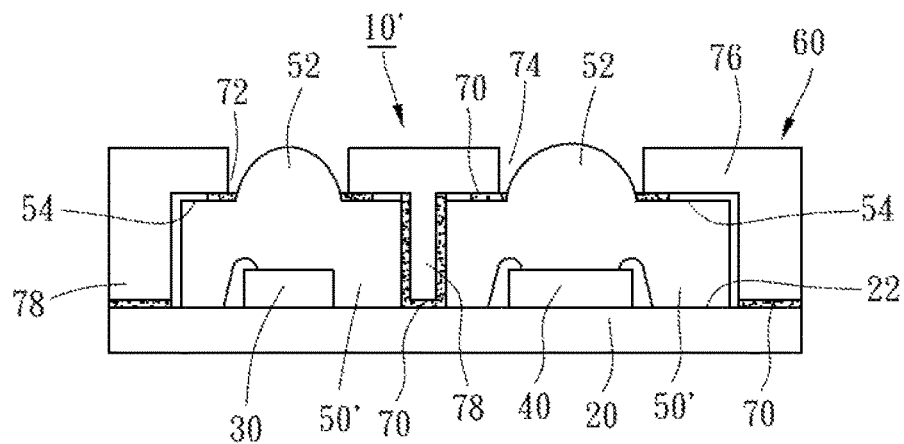

Through the aforesaid steps, the package structure 10' of the long-distance sensor as shown in FIG. 3 is manufactured by the packaging method of the second preferred embodiment.

In summary of the above description, the cap 60 is fastened to the bearing surface 22 and the packaging gel bodies 50, 50' by the adhesive 70, so that the connection between the materials of the package structure 10, 10' is improved. Besides, the cap 60 is preformed, therefore when the cap 60 is manufactured, the light-emitting hole 72 and the light-receiving hole 74 can be provided with specific size for being located near the lens portions 52. Then, the cap 60 is directly fastened to the bearing surface 22 and the packaging gel bodies 50, 50' by the adhesive 70. Because the light-emitting hole 72 and the light-receiving hole 74 can be located near the lens portions 52, the sensing distance of the long-distance sensor can be increased.

At last, it should be mentioned again that the components disclosed in the above embodiments of the present invention are instanced for illustration only, not for limiting the scope of the invention. It will be obvious that the same may be varied and modified in many ways. Such variations and modifications are intended to be included within the scope of the following claims.

What is claimed is:

1. A package structure of a long-distance sensor, the package structure comprising:
    a substrate having a bearing surface;
    a light-emitting chip disposed on the bearing surface;
    a sensing chip disposed on the bearing surface and separated from the light-emitting chip;
    two packaging gel bodies covering the light-emitting chip and the sensing chip respectively and separated from each other; and
    a cap disposed on the bearing surface and the packaging gel bodies, fastened to the bearing surface and the packaging gel bodies by adhesive, and provided with a light-emitting hole located above the light-emitting chip and a light-receiving hole located above the sensing chip;
    wherein a top surface of each of the packaging gel bodies has a lens portion and a shoulder portion; the cap comprises a transverse section provided with the light-emitting hole and the light-receiving hole; the transverse section of the cap is directly fastened to the shoulder portions of the top surfaces of the packaging gel bodies by the adhesive.

2. The package structure as claimed in claim 1, wherein for the top surface of each of the packaging gel bodies, the shoulder portion surrounds the lens portion.

3. The package structure as claimed in claim 1, wherein the lens portions are hemisphere-shaped and accommodated in the light-emitting hole and the light-receiving hole respectively.

4. The package structure as claimed in claim 1, wherein a groove is provided between the two packaging gel bodies; the cap comprises a plurality of extended sections which are extended downwardly from the transverse section, located at the groove and peripheries of the packaging gel bodies respectively, and fastened to the bearing surface by the adhesive.

5. The package structure as claimed in claim 1, wherein the light-emitting chip and the sensing chip are electrically connected with the substrate by wire bonding.

6. The package structure as claimed in claim 1, wherein the packaging gel bodies are formed by molding.

7. The package structure as claimed in claim 1, wherein the packaging gel bodies are made of a transparent material, and the cap is made of an opaque material.

* * * * *